(12) United States Patent
Shiga

(10) Patent No.: US 6,181,610 B1
(45) Date of Patent: Jan. 30, 2001

(54) SEMICONDUCTOR DEVICE HAVING CURRENT AUXILIARY CIRCUIT FOR OUTPUT CIRCUIT

(75) Inventor: Takanori Shiga, Kawasaki (JP)

(73) Assignee: Fujitsu Limited, Kanagawa (JP)

( * ) Notice: Under 35 U.S.C. 154(b), the term of this patent shall be extended for 0 days.

(21) Appl. No.: 09/468,938

(22) Filed: Dec. 22, 1999

(30) Foreign Application Priority Data

Dec. 25, 1998 (JP) .................................................. 10-371184

(51) Int. Cl.[7] ....................................................... G11C 7/00
(52) U.S. Cl. ....................... 365/189.05; 365/148; 365/149
(58) Field of Search .............................. 365/189.05, 196, 365/207, 212, 230.08, 189.08, 149, 148

(56) References Cited

U.S. PATENT DOCUMENTS 5,293,081 * 3/1994 Chiao et al. ......................... 307/270
5,850,159 * 12/1998 Chow et al. ......................... 327/394

* cited by examiner

*Primary Examiner*—David Nelms
*Assistant Examiner*—Thong Le
(74) *Attorney, Agent, or Firm*—Arent Fox Kintner Plotkin & Kahn, PLLC

(57) ABSTRACT

A semiconductor device comprises an output circuit 31 for flowing out a source current IH or flowing in a sink current IL depending on an input signal AO and an output enable signal OE, a source current auxiliary circuit 32, and a sink current auxiliary circuit 33. The circuit 32 comprises a capacitor C1 connected so that the capacitor C1 can be charged through a transistor SW1 and a resistor R1, and a transfer gate T1 connected between a higher-potential-side electrode of the capacitor C1 and the output 16 the device. The sink current auxiliary circuit 33 comprises a capacitor C2 connected so that the capacitor C2 can discharge through a resistor R2 and a transistor SW2, and a transfer gate T2 connected between a higher-potential-side electrode of the capacitor C2 and the output 16 of the device.

14 Claims, 7 Drawing Sheets

SEMICONDUCTOR DEVICE HAVING CURRENT AUXILIARY CIRCUIT FOR OUTPUT CIRCUIT

BACKGROUND OF THE INVENTION

1. Field of the Invention

The present invention relates to a semiconductor device provided with an output circuit and a source or sink current auxiliary circuit for the output circuit.

2. Description of the Related Art

As shown in FIG. 7, there is provided an output circuit 11 for driving in the output stage of a semiconductor device 10. In the circuit 11, a PMOS transistor 12 and an NMOS transistor 13 are serially connected between a power supply line VDD and a grounded line. Gate potentials of the transistors 12 and 13 are controlled by a logic circuit 14 in response to an input signal AO and an output enable signal OE. The drains of the transistors 12 and 13 are commonly connected through an output pad 15 to an output 16. The output 16 is connected to an input terminal 18 of another circuit 17.

In a case where the output enable signal OE is low, the gates of the transistors 12 and 13 are respectively high and low with no dependency on the signal AO, whereby the transistors 12 and 13 are off and the output DO of the output circuit 11 is in a high impedance state.

In a case where the output enable signal OE is high, the logic circuit 14 is in a through state and thereby, if the signal AO is low, the transistors 12 and 13 are respectively on and off and a source current IH flows out from the power supply line VDD through the PMOS transistor 12 to the circuit 17, while if the signal AO is high, the transistors 12 and 13 are respectively off and on and a sink current IL flows from the circuit 17 though the NMOS transistor 13 to the grounded line.

CL depicted with dotted lines shows a load capacitance viewed from the output of the output circuit 11. The load capacitance CL is large since it includes capacitance of the output pad 15 and the output 16 having comparatively large areas and capacitance of comparatively long line connected to them and therefore, a signal waveform at the input terminal 18 is rounded and an operating speed is reduced.

In a semiconductor device, a higher operating speed is demanded and if, in order to achieve the demand, the source current IH and the sink current IL are both increased, the power supply potential VDD is temporarily lowered when the source current IH flows and the grounded potential is temporarily raised when the sink current IL flows, resulting in generating power supply noise.

Further, in order to increase the currents IH and IL, the transistors 12 and 13 have to be larger in size and therefore, a semiconductor chip area increases, which in turn entails a higher cost in production.

SUMMARY OF THE INVENTION

Accordingly, it is an object of the present invention to provide a semiconductor device having an output circuit that is capable of realizing not only a higher operating speed, but also suppression of a power supply potential variation.

It is another object of the present invention to provide a semiconductor device having an output circuit that is capable of realizing not only a higher operating speed, but also suppression of increase in chip area.

In one aspect of the present invention, there is provided a semiconductor device comprising: an output circuit having an output to flow out a source current or flow in a sink current depending on an input signal; a source current auxiliary circuit including: a first capacitor having first and second electrodes, the first and second electrodes being coupled to first and second power supply potentials, respectively; and a first transfer gate coupled between the first electrode and the output, and a control circuit for discharging the first capacitor by temporarily making the first transfer gate on when the source current flows out from the output circuit, wherein the first capacitor is able to charge when the transfer gate is off.

With the above present invention, when the source current flows out from the output circuit, an auxiliary source current generated by discharge of the first capacitor is added to the source current and therefore, an operating speed is higher than in a case where only the current from the output circuit flows. Since this discharge is different from a current from the first power supply line, a temporary drop in potential of the first power supply line is suppressed.

Other aspects, objects, and the advantages of the present invention will become apparent from the following detailed description taken in connection with the accompanying drawings.

DESCRIPTION OF THE PREFERRED EMBODIMENTS

Figure 1:
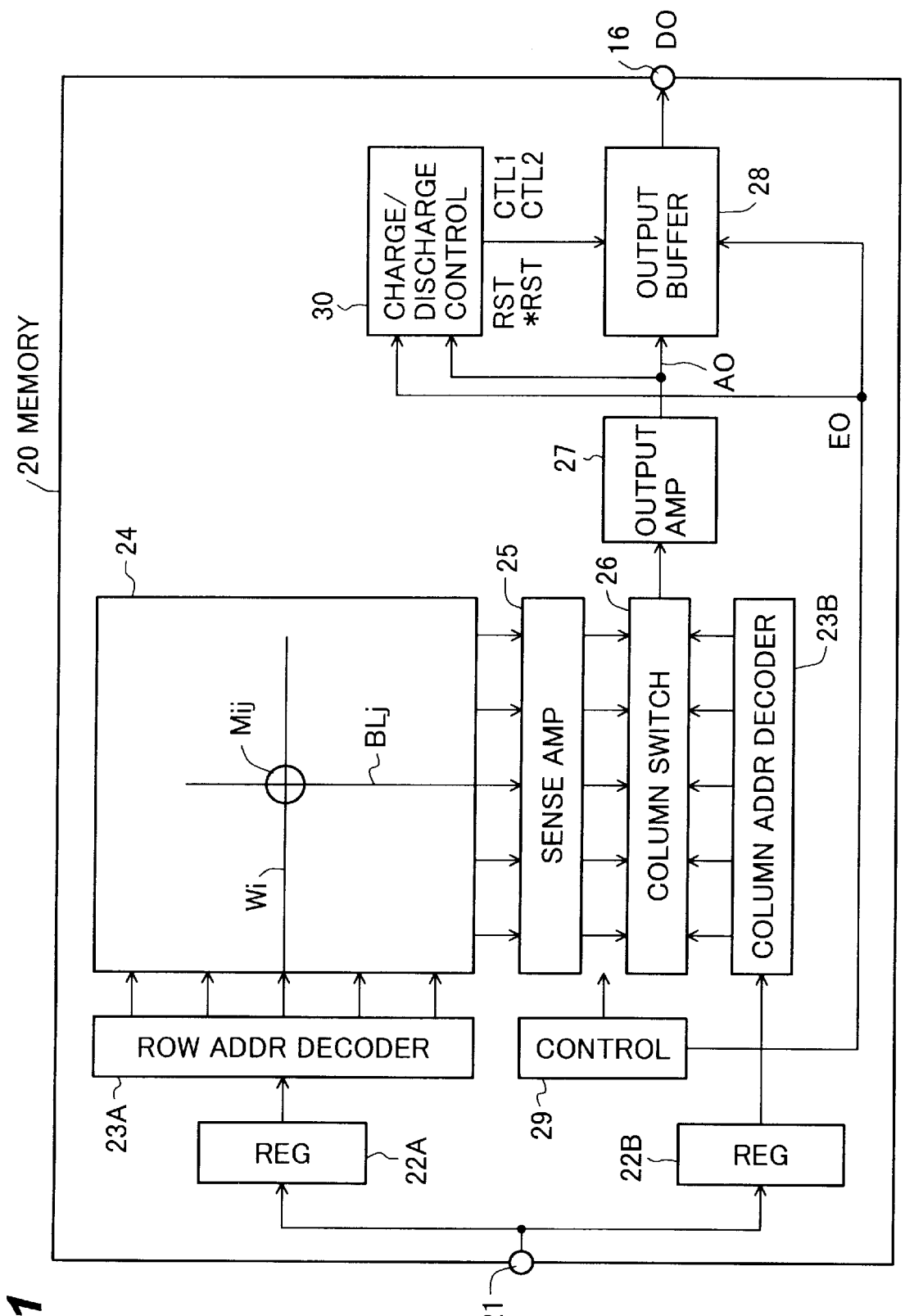
FIG. 1 is a schematic block diagram showing a semiconductor memory device of a first embodiment according to the present invention.

Referring now to the drawings, wherein like reference characters designate like or corresponding parts throughout several views, preferred embodiments of the present invention are described below.

It should be noted that the use of the terms "connected" and "coupled" indicates an electrical connection between two elements and can include an intervening element between the two "coupled" or "connected" elements.

First Embodiment

FIG. 1 is a schematic block diagram showing a semiconductor memory device of a first embodiment according to the present invention.

A semiconductor memory device 20 to which the present invention is applied is only required to provide at least a data read function and there is no limitation to a kind thereof.

In the semiconductor memory device 20, a row address RA provided to an address input terminal 21 is held in a row address buffer register 22A, and the row address RA is decoded by a row address decoder 23A and a word line in a memory cell array 24 is selected. With the selection, signals are read out on bit lines from memory cells coupled to the selected word line. For example, a word line WLi of the i-th row is selected and data of a memory cell MCij is read out on a bit line BLj of the j-th column. A sense amplifier 25 is then activated and the read-out signals are amplified.

A column address CA provided to the address input terminal 21 is held in a column address buffer register 22B, and the column address CA is decoded by a column address decoder 23B and a switch in a column switch circuit 26 is selectively turned on. One of amplified signals, which is selected in the column switch circuit 26, is sent onto a data bus line on which a potential has been reset, amplified in an output amplifier 27 and provided to an output buffer circuit 28 as a signal AO.

At a time point when the output of the output amplifier 27 is estimated to have been settled, for example at a time point when a given time period has elapsed from a time when the column switch had been turned on, an output enable signal OE which is provided to the output buffer circuit 28 from a control circuit 29 goes high and the output DO of the output buffer circuit 28 becomes effective. The control circuit 29 controls timing of all the operations. A charge/discharge control circuit 30 generates complementary reset signals RST and *RST and control signals CTL1 and CTL2 shown in FIG. 3 or 4 depending on the signal AO and the output enable signal OE, and provides those generated signals to the output buffer circuit 28.

Figure 2:
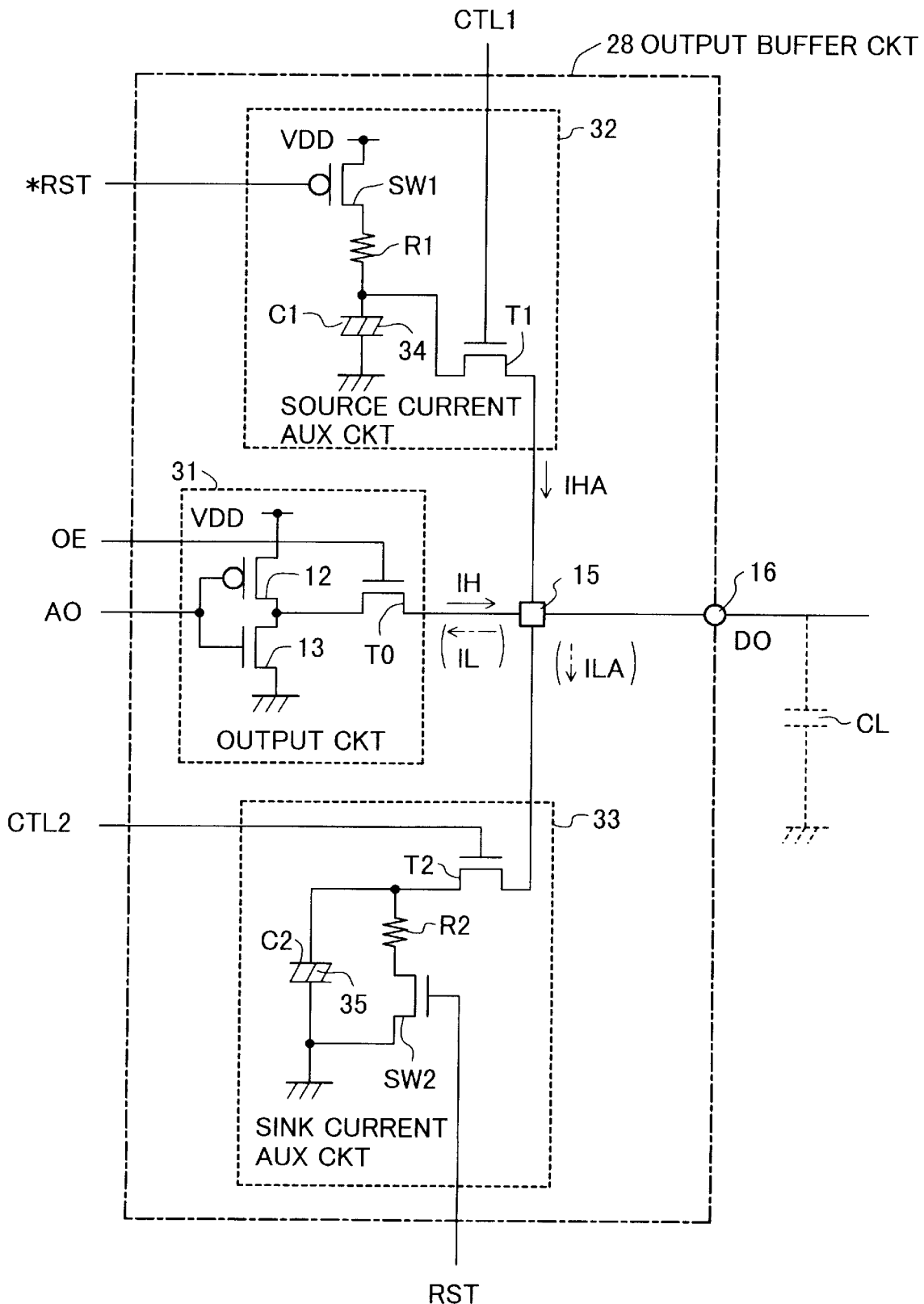
FIG. 2 is a diagram showing an embodiment of the output buffer circuit in FIG. 1.

FIG. 2 is a circuit diagram showing an embodiment of the output buffer circuit 28.

Figure 7:
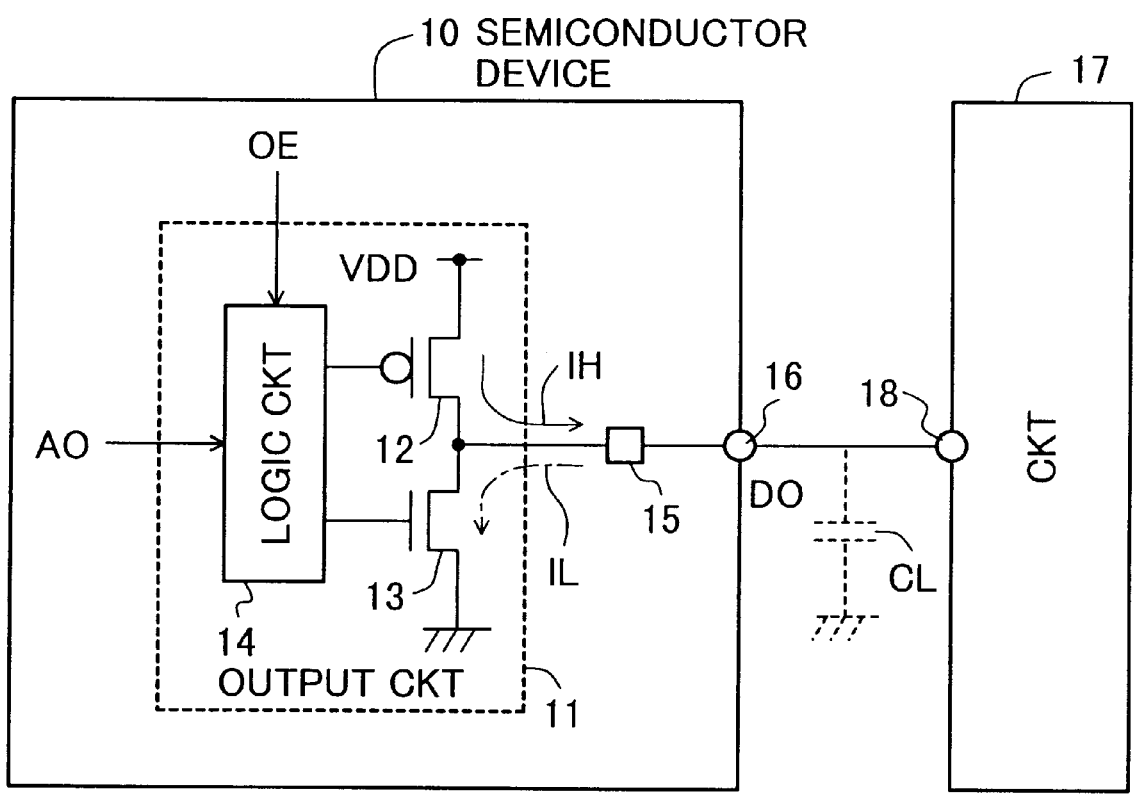
FIG. 7 is a schematic block diagram showing a prior art semiconductor memory device.

The output buffer circuit 28 comprises an output circuit 31 corresponding to the output circuit 11 in FIG. 7, a source current auxiliary circuit 32 for additionally increasing a source current flowing out from the output buffer circuit 28, and a sink current auxiliary circuit 33 for additionally increasing a sink current flowing into the output buffer circuit 28.

In the output circuit 31, instead of the logic circuit 14 in FIG. 7, an NMOS transistor TO as a transfer gate is connected between a connection point, which is between the drains of the PMOS transistor 12 and the NMOS transistor 13, and the output pad 15, the output enable signal OE is provided to the gate electrode of the transistor TO and the signal AO is provided to the gate electrodes of the transistors 12 and 13.

In the source current auxiliary circuit 32, one electrode of a capacitor C1 is connected through a resistor R1 and a PMOS transistor SW1 to the power supply line VDD, the other electrode of the capacitor C1 is connected to the grounded line, and the capacitor C1 can be charged (reset) by turning the PMOS transistor SW1 on. The one electrode of the capacitor C1 is further connected to the output pad 15 through an NMOS transistor T1 as a transfer gate. By turning the NMOS transistor T1 on when the source current IH flows, the capacitor C1 is discharged and thereby, a current IHA added to a source current IH flows out. The reset signal *RST and the discharge control signal CTL1 are respectively provided to the gate electrodes of the transistors SW1 and T1.

In the sink current auxiliary circuit 33, one electrode of a capacitor C2 is connected to the other electrode thereof through a resistor R2 and an NMOS transistor SW2, the other electrode of the capacitor C2 is further connected to the grounded line and, by turning the NMOS transistor SW2 on, the capacitor C2 can be discharged (reset). The one electrode of the capacitor C2 is further connected to the output pad 15 through an NMOS transistor T2 as a transfer gate. By turning the NMOS transistor T2 on when the sink current from the output 16 flows in, part of the current is made to flow through the NMOS transistor T2 as an auxiliary sink current ILA and the capacitor C2 is thus charged. The reset signal RST and the charge control signal CTL2 are respectively provided to the gate electrodes of the NMOS transistors SW2 and T2.

Dielectric 34 and 35, for example ferroelectric, each having a large dielectric constant, are respectively interposed between electrodes of the capacitors C1 and C2 in order to achieve more of capacitance with a narrower electrode area.

Figure 3:
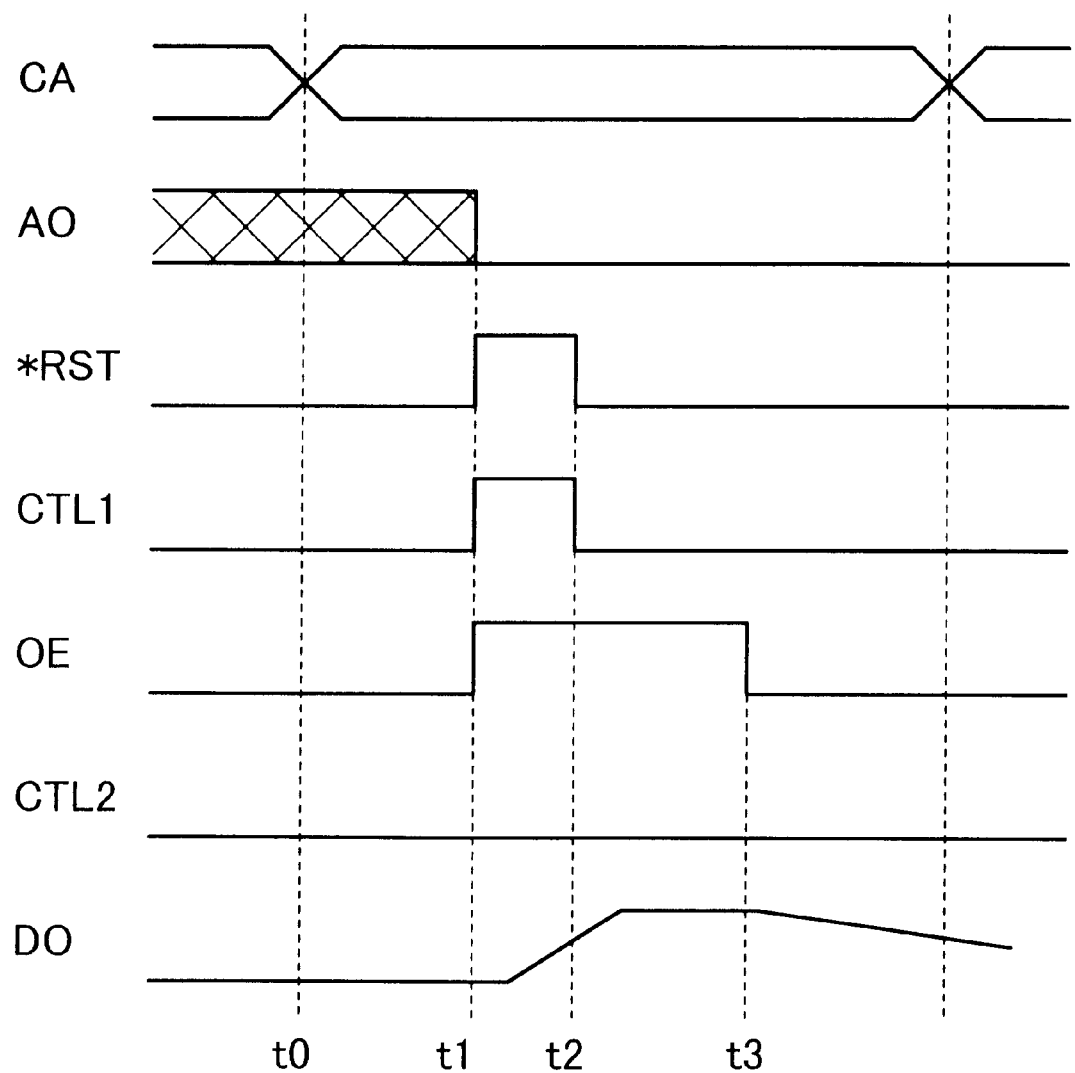
FIG. 3 is a time chart showing operations in a case where an output circuit receives a signal AO having a low level.

Next, description with reference to FIG. 3 will be made of operations in a case where the output circuit 31 receives the signal AO having a low level.

A column address CA is held in the row address buffer register 22A at a time t0. At this time point, since an output enable signal OE is low and the NMOS transistor TO is off, the output of the output circuit 31 is in a high impedance state. Further, a reset signal *RST and a control signal CTL1 are both low, whereby the PMOS transistor SW1 is on and the NMOS transistor T1 is off, therefore the capacitor C1 is in a charged (reset) state and the output of the source current auxiliary circuit 32 is in a high impedance state. Besides, the reset signal RST and the control signal CTL2 are high and low respectively, whereby the NMOS transistors SW2 and T2 are on and off respectively, therefore the capacitor C2 is in a discharged (reset) state and the output of the sink current auxiliary circuit 33 is in a high impedance state.

At a time t1 when a given time period elapsed from the time t0, a low state of the signal AO is settled. Thereby, the PMOS transistor 12 and the NMOS transistor 13 are on and off, respectively. A portion having cross hatch in FIG. 3 indicates that its signal level is before being estimated to have been settled. At the time t1, the output enable signal OE goes high, whereby the NMOS transistor T0 is turned on and the source current IH starts to flow to the output pad 15 from the output circuit 31. Further, the charge/discharge control circuit 30 in FIG. 1 makes the reset signals RST and *RST, which are complementary to each other, go low and high respectively in response to a rise of the output enable signal OE. Thereby, the PMOS transistor SW1 and the NMOS transistor SW2 are both turned off. The charge/discharge control circuit 30, with acknowledging that the signal AO is low just before the time ti and therefore, makes the control signal CTL1 go high in response to a rise of the output enable signal OE. Thereby, the NMOS transistor T1 is turned on, the capacitor C1 is discharged and the auxiliary source current IHA starts to flows to the output pad 15 from the source current auxiliary circuit 32. Accordingly, the source current (IH+IHA) flows out from the output 16.

Since the auxiliary source current IHA has a steep rise transition, the source current (IH+IHA) also has a steep rise transition and therefore, an operating speed is increased compared with a case where only the source current IH flows. At this time, since the PMOS transistor SW1 is off, a rapid change of a current flowing out from the power supply line VDD is suppressed, resulting in that a potential drop of the VDD line is also suppressed.

Although a potential of the output pad 15 is raised by the flow-out of the source current IH and the auxiliary current IHA, a voltage of the capacitor C1 is lowered. In order to prevent inversion of a direction of the auxiliary source current IHA that would be caused by a change of a relation in height between the potentials of the output pad 15 and the capacitor C1, and since realization of a higher operating speed is sufficiently secured if the auxiliary source current IHA is utilized until halfway through the rise of the source current IH, the charge/discharge control circuit 30 returns the reset signal *RST and the control signal CTL1 both to low states at a time t2 until which a given time has elapsed from the time t1. Thereby, the PMOS transistor SW1 and the NMOS transistor T1 are turned on and off, respectively, charge to the capacitor C1 is started, and the output of the source current auxiliary circuit 32 simultaneously enters into a high impedance state.

In order to simplify reset control of the capacitor C2, the reset signal RST, which is complementary to the reset signal *RST, are used for the reset. Hence, the NMOS transistor SW2 is kept off from the time t1 until the time t2, but there arises no problem since the capacitor C2 secures a sufficient discharge time.

At a time t3, the output enable signal OE goes low and thereby, the NMOS transistor T0 is turned off and the output of the output circuit 31 enters into a high impedance state.

Figure 4:
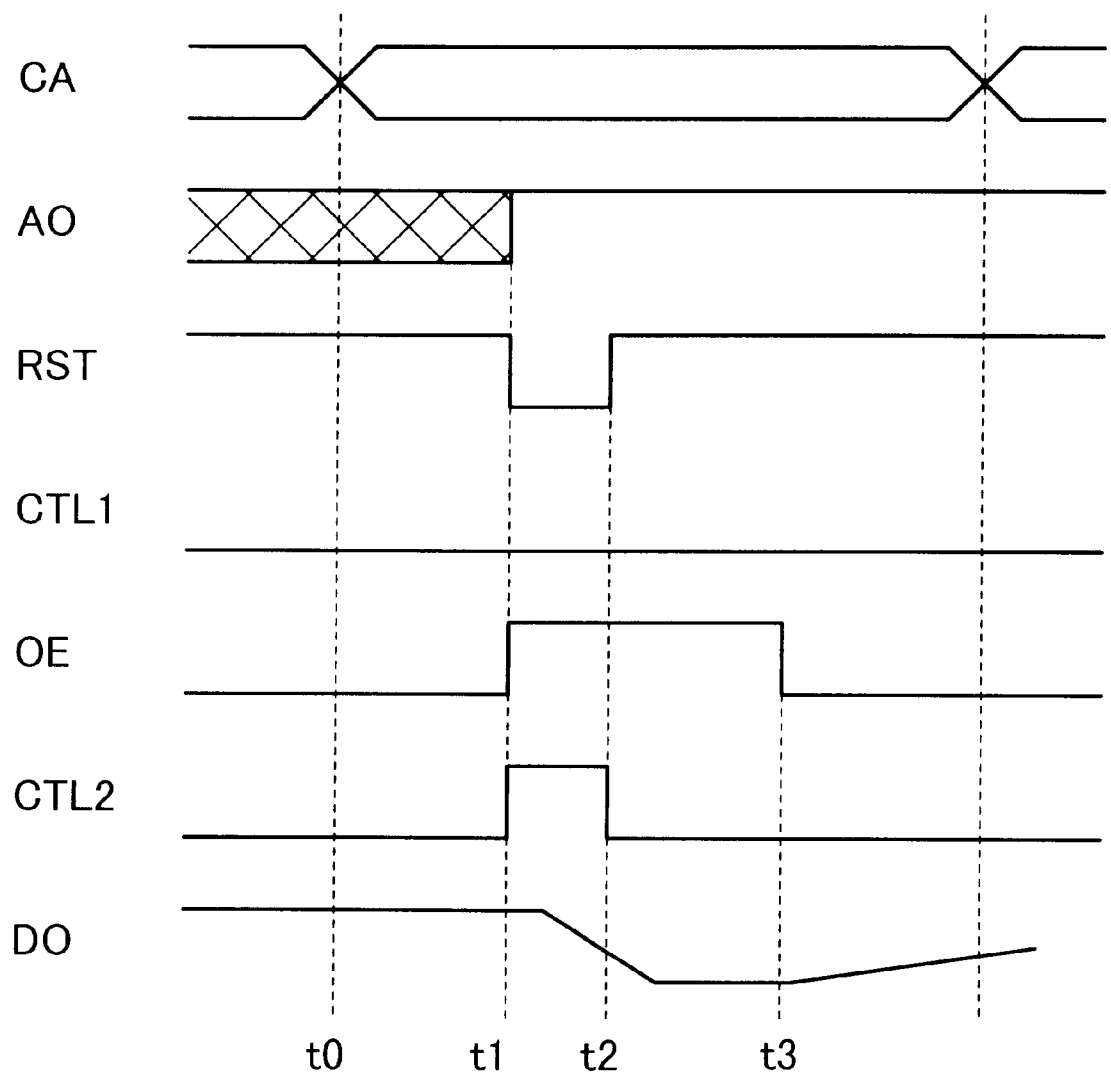
FIG. 4 is a time chart showing operations in a case where the output circuit receives the signal AO having a high level.

Next, description with reference to FIG. 4 will be made of operations in a case where the output circuit 31 receives the signal AO having a high level.

Operations until just before the time t1 are same as in the above-described case. A high state of the signal OA at the time t1 is settled. Hence, the PMOS transistor 12 and the NMOS transistor 13 are off and on, respectively.

The charge/discharge control circuit 30, with acknowledging that the signal AO is high just before the time t1 and therefore, makes the control signal CTL2 go high in response to a rise of the output enable signal OE. Thereby, the NMOS transistors T1 and T2 are both turned on, the sink current IL and the auxiliary sink current ILA flow into the output circuit 31 and the sink current auxiliary circuit 33, respectively, from the output pad 15 and thereby, the capacitor C2 is charged. That is, the sink current (IL+ILA) flows into the output buffer circuit 28 from the output 16.

Since the auxiliary sink current ILA has a steep rise transition, the sink current (IL+ILA) also has a steep rise transition and therefore, an operating speed is increased compared with a case where only the sink current IL flows. During the RST is low, since the NMOS transistor SW2 is off, a rapid change of a current flowing into the grounded line is suppressed, resulting in that a potential rise of the grounded line is also suppressed.

Although a potential of the output pad 15 is raised by the flow-out of the source current IH and the auxiliary current IHA, a voltage of the capacitor C1 is lowered. In order to prevent inversion of a direction of the auxiliary source current IHA that would be caused by a change of a relation in height between the potentials of the output pad 15 and the capacitor C1, and since realization of a higher operating speed is sufficiently secured if the auxiliary source current IHA is utilized until halfway through the rise of the source current IH, the charge/discharge control circuit 30 returns the reset signal *RST and the control signal CTL1 both to low states at a time t2 until which a given time has elapsed from the time t1. Thereby, the PMOS transistor SW1 and the NMOS transistor T1 are turned on and off, respectively, charge to the capacitor C1 is started, and the output of the source current auxiliary circuit 32 simultaneously enters into a high impedance state.

A voltage of the capacitor C2 is raised by the flowing-in of the auxiliary sink current ILA. In order to prevent inversion of a direction of the auxiliary sink current ILA which would be caused by a change of a relation in height between the potentials of the output pad 15 and the capacitor C2.

Since the auxiliary sink current ILA has a steep rise transition, a rise transition of the sink current (IL+ILA) is also steep and therefore, an operating speed is high compared with a case where only the ink current IL flows. Further, since the NMOS transistor SW2 is off, a rapid change of a current flowing to the grounded line is suppressed with the result that increase in potential thereof is restrained.

A voltage of the capacitor C2 is raised by the flowing-in of the auxiliary sink current ILA. In order to prevent inversion of a direction of the auxiliary sink current ILA which would be caused by a change of a relation in height between the potentials of the output pad 15 and the capacitor C2, or since realization of a higher operating speed is sufficiently secured if the auxiliary sink current ILA is utilized until halfway through the fall of the sink current IL, the charge/discharge control circuit 30 returns the reset signal RST and the control signal CTL2 both to high and low states, respectively, at the time t2 until which a given time has elapsed from the time t1. Thereby, the NMOS transistor SW2 and T2 are turned on and off, respectively, discharge to the capacitor C2 is started, and the output of the sink current auxiliary circuit 33 simultaneously enters into a high impedance state.

Although the PMOS transistor SW1 is kept off from the time t1 until the time t2, there arises no problem, since the capacitor C1 secures a sufficient charge time.

At a time t3, the output enable signal OE goes low and thereby, the NMOS transistor TO is turned off and the output of the output circuit 31 enters into a high impedance state.

Although the capacitors C1 and C2 require occupancy areas on a chip, since dielectric with a high dielectric constant can be interposed between the electrodes of each capacitor C1 and C2, the sum of occupancy areas of the capacitors and the transistors 12 and 13 can be smaller than the sum of occupancy areas required in a case where only the transistors 12 and 13 are employed with the same operating speed as that of the present embodiment is achieved. Besides, variations in the power supply potential and grounded line can be reduced as described above.

Second Embodiment

Figure 5:
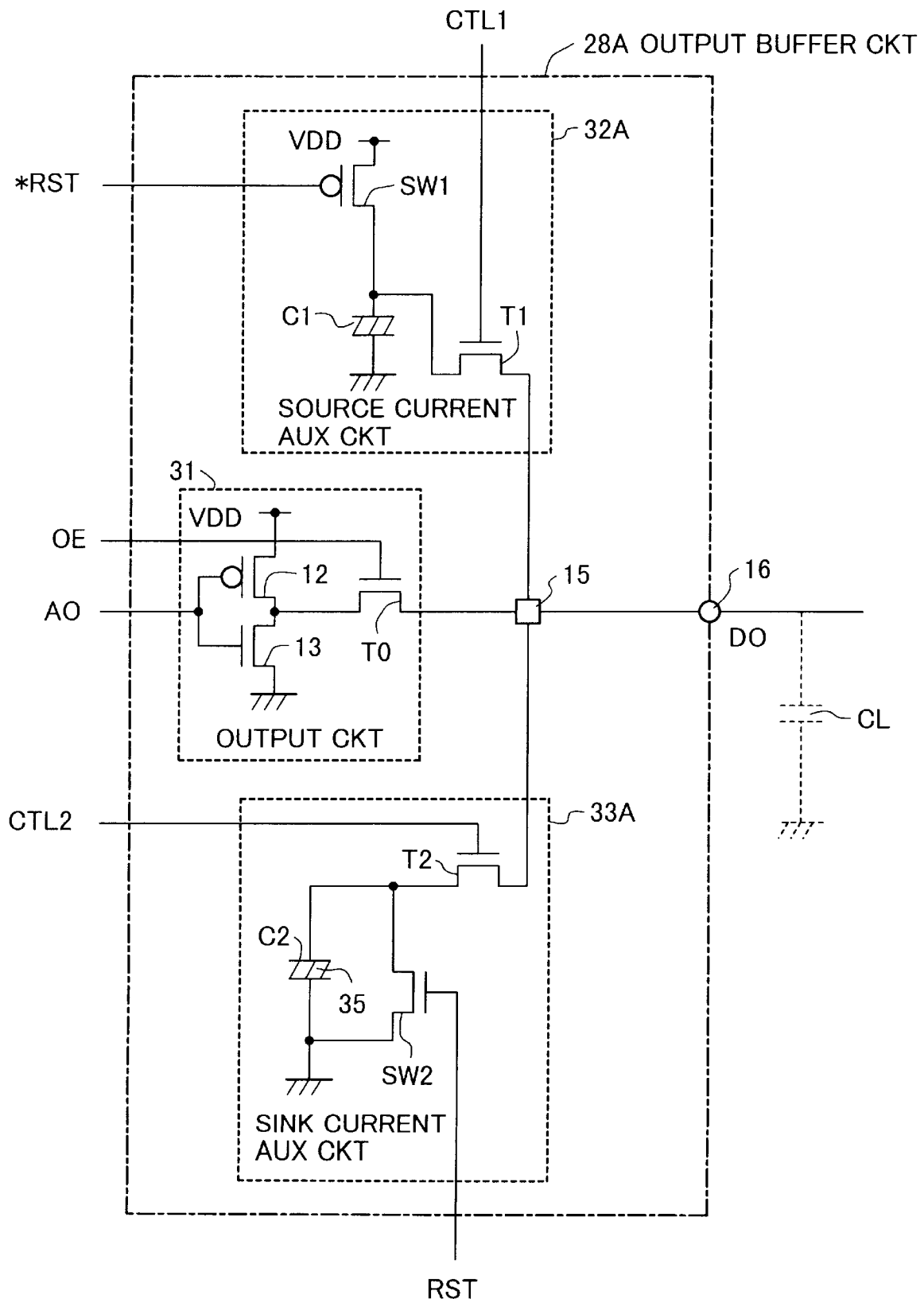
FIG. 5 is a diagram showing a circuit of a second embodiment according to the present invention, corresponding to the circuit of FIG. 2.

FIG. 5 shows a circuit of a second embodiment according to the present invention, corresponding to FIG. 2.

In the circuit, on-resistance of each of the PMOS transistor SW1 and the NMOS transistor SW2 is increased by reducing a ratio of (a gate width)/(a gate length) of both transistors and thereby, the resistors R1 and R2 of FIG. 2 are omitted. The other points are same as those of the first embodiment.

Third Embodiment

Figure 6:
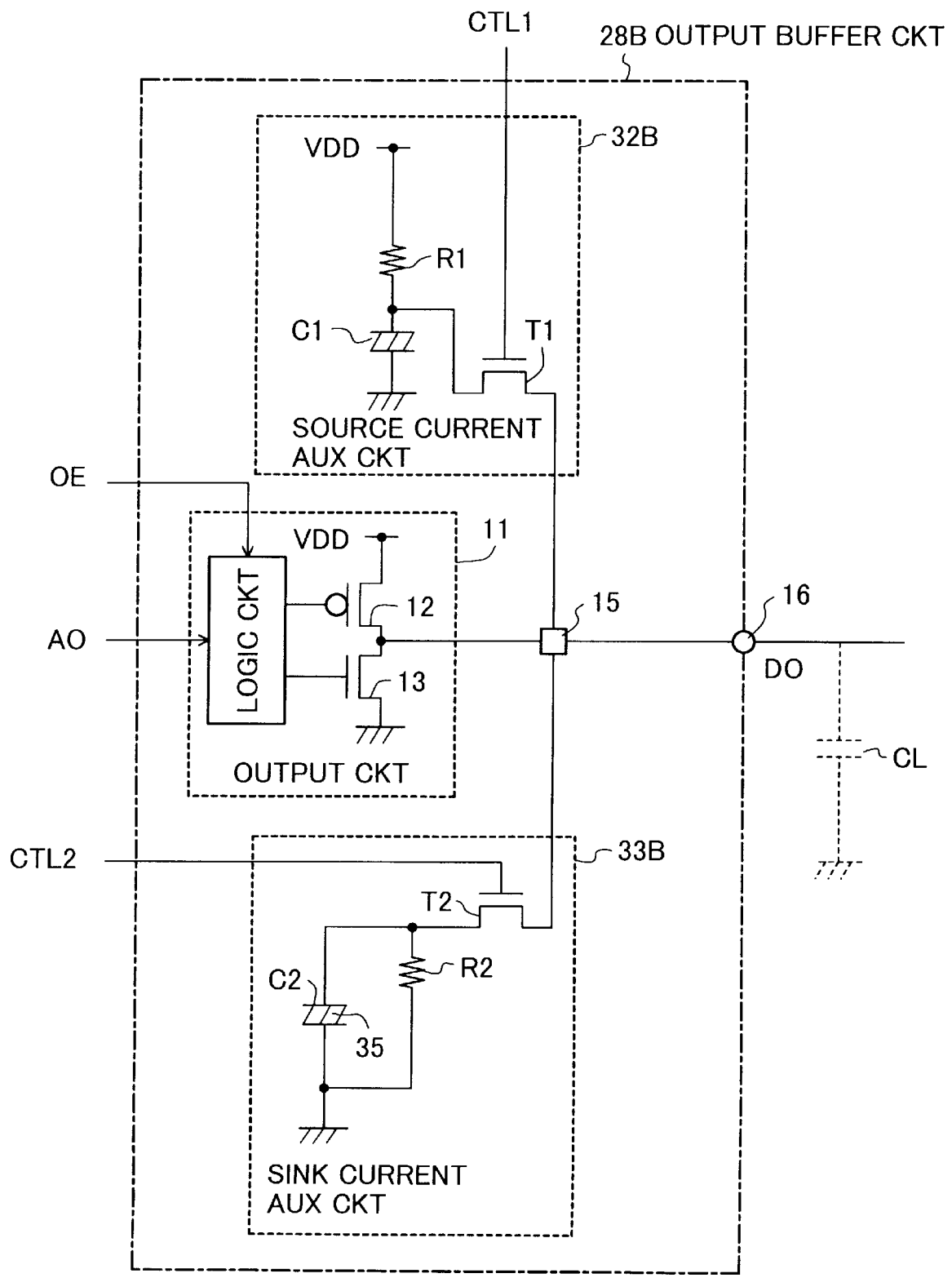
FIG. 6 is a diagram showing a circuit of a third embodiment according to the present invention, corresponding to the circuit of FIG. 2.

FIG. 6 shows a circuit of a third embodiment according to the present invention, corresponding to FIG. 2.

In the circuit, the PMOS transistor SW1 and the NMOS transistor SW2 of FIG. 2 are omitted. With the omission, although a current that flows out from the power supply line VDD or flows into the grounded line during the time period between the time points t1 and t2 of FIG. 2 or 3 in which the auxiliary source current or the auxiliary sink current flows is increased compared with the case of the first embodiment, currents that respectively flow through the resistors R1 and R2 are limited by the resistances thereof.

Further, the output circuit 11 of FIG. 7 is employed instead of the output circuit 31 of FIG. 2.

Although preferred embodiments of the present invention has been described, it is to be understood that the invention is not limited thereto and that various changes and modifications may be made without departing from the spirit and scope of the invention.

For example, in the source current auxiliary circuit 32 of FIG. 2, it is unnecessary that a source potential of the PMOS transistor SW1 is made to be equal to the source potential VDD of the PMOS transistor 12 and further, a reference-potential-side electrode of the capacitor C1 is not required to be the ground potential. Likewise, a source potential of the NMOS transistor SW2 and a potential of a reference-potential-side electrode of the capacitor C2 are not required to be the ground potential. For example, it is allowed that this electrode is set at a negative potential to increase the auxiliary sink current ILA.

Further, an application of the present invention is not limited to a semiconductor memory device with a data read function, but is applicable to various kinds of other semiconductor devices each with an output buffer circuit therein.

What is claimed is:

1. A semiconductor device comprising:
   an output circuit having an output to flow out a source current or flow in a sink current depending on an input signal;
   a source current auxiliary circuit including:
      a first capacitor having first and second electrodes, said first and second electrodes being coupled to first and second power supply potentials, respectively; and
      a first transfer gate coupled between said first electrode and said output, and
   a control circuit for discharging said first capacitor by temporarily making said first transfer gate on when said source current flows out from said output circuit,
   wherein said first capacitor is able to charge when said transfer gate is off.

2. A semiconductor device according to claim 1, wherein said first capacitor has a dielectric interposed between said first and second electrodes.

3. A semiconductor device according to 2, further comprising a first resistor coupled between said first electrode and said first power supply potential.

4. A semiconductor device according to claim 3,
   wherein said output circuit is in a high impedance state when an output enable signal is inactive, and
   wherein said control circuit turns on said first transfer gate in response to said output enable signal being turned active.

5. A semiconductor device according to claim 4, wherein said control circuit turns off said first transfer gate halfway through a rise of a potential of said output.

6. A semiconductor device according to claim 2, further comprising a first switching transistor coupled between said first power supply potential and said first electrode,
   wherein said control circuit keeps said first switching transistor off during said first transfer gate being on.

7. A semiconductor device according to claim 2, further comprising a sink current auxiliary circuit, said sink current auxiliary circuit including:
   a second capacitor having third and fourth electrodes, said fourth electrode being coupled to said second power supply potential; and
   a second transfer gate coupled between said third electrode and said output,
   wherein said control circuit charges said second capacitor by temporarily making said second transfer gate on when said sink current flows into said output circuit,
   wherein said second capacitor is able to discharge when said second transfer gate is off.

8. A semiconductor device according to claim 7, wherein said second capacitor has a dielectric interposed between said third and fourth electrodes.

9. A semiconductor device according to claim 8, further comprising a second resistor coupled between said third and fourth electrodes.

10. A semiconductor device according to claim 9,
    wherein said output circuit is in a high impedance state when an output enable signal is inactive, and
    wherein said control circuit turns on said second transfer gate in response to said output enable signal being turned active.

11. A semiconductor device according to claim 10, wherein said control circuit turns off said second transfer gate halfway through a fall of a potential of said output.

12. A semiconductor device according to claim 8, further comprising a second switching transistor coupled between said third and fourth electrodes,
    wherein said control circuit keeps said second switching transistor off during said second transfer gate being on.

13. A semiconductor device according to claim 2, wherein said semiconductor device is a memory device further comprising an output amplifier for amplifying a signal read on a data bus line and providing the amplified signal to said output circuit as said input signal, and
    wherein said control circuit controls said first transfer gate with acknowledging said source current or said sink current on the basis of said input signal.

14. A semiconductor device according to claim 8, wherein said semiconductor device is a memory device further comprising an output amplifier for amplifying a signal read on a data bus line and providing the amplified signal to said output circuit as said input signal, and
    wherein said control circuit controls said first transfer gate with acknowledging said source current or said sink current on the basis of said input signal.

* * * * *